United States Patent [19]
Tsuda

[11] 3,944,941
[45] Mar. 16, 1976

[54] SWITCHING CIRCUIT FOR USE WITH BALANCED TRANSFORMERLESS AMPLIFIER

[75] Inventor: Akira Tsuda, Matsudo, Japan

[73] Assignee: Sony Corporation, Tokyo, Japan

[22] Filed: July 26, 1974

[21] Appl. No.: 492,331

[30] Foreign Application Priority Data
Aug. 1, 1973 Japan.......................... 48-91037[U]

[52] U.S. Cl................. 330/51; 179/1 G; 179/1 SW; 330/124 R
[51] Int. Cl.²......................................... H03F 3/68
[58] Field of Search ... 330/126, 51; 179/1 G, 1 GQ, 179/1 SW, 1 GA

[56] References Cited
UNITED STATES PATENTS

| | | |
|---|---|---|
| 3,026,373 | 3/1962 | Fine et al.............................. 179/1 G |
| 3,026,378 | 3/1962 | Fine et al.......................... 179/1 G X |
| 3,329,772 | 7/1967 | Farrell ................................. 179/1 G |

*Primary Examiner*—James B. Mullins
*Attorney, Agent, or Firm*—Lewis H. Eslinger; Alvin Sinderbrand

[57] ABSTRACT

An output circuit for balanced amplifiers connected to one terminal of each of two loudspeakers with the other terminal of each loudspeaker connected together to the arm of a double-throw switch to make contact either with a terminal connected to the first terminal of one load to short circuit that load while applying signals from the amplifiers differentially to the other load, or to connect the second terminals of each of the loudspeakers to a common signal output terminal of the amplifiers so that each load is connected across a respective amplifier output circuit.

5 Claims, 2 Drawing Figures

SWITCHING CIRCUIT FOR USE WITH BALANCED TRANSFORMERLESS AMPLIFIER

BACKGROUND OF THE INVENTION

1. Field of the Invention

This invention relates to a circuit for connecting a pair of balanced signals selectively to separate loads or differentially to one of the loads while short circuiting the other load. In particular, it relates to a circuit for connecting balanced transformerless amplifiers selectively to corresponding loudspeakers or differentially to a single loadspeaker while short circuiting the unused loudspeaker.

2. The Prior Art

In 4-channel stereophonic sound reproduction four loudspeakers, each of which may include one or more drivers, if desired, are placed at the corners of a quadrilateral area. It is anticipated that the audience will face in the general direction of two of the speakers, which are referred to as the left-front and right-front speakers, and that the other two speakers will be behind the audience and are referred to as the left-back and right-back speakers. Four corresponding amplifiers are provided a left-front, a right-front, a leftback, and a right-back amplifier. If suitable audio signals from these amplifiers are presented to the four speakers, a high degree of realism may be obtained in the reproduced sound.

However, much information is recorded or transmitted only in the form of 2-channel stereophonic signals that do not include the proper information to reproduce 4-channel sound, and in that case it may be preferable to utilize only the two front speakers. It is still desirable to use all four amplifiers.

Heretofore, switching systems have been provided between the four amplifiers of a 4-channel playback system and the respective loudspeakers to disconnect the back speakers and to apply the output signals from the corresponding amplifiers to the front speakers. Thus, the amplifier that would normally feed the right-back speaker is connected to the right-front speaker and the output signal from the amplifier that would normally feed the left-back speaker is connected to the left-front speaker. The two back speakers have simply been left in an open-circuit condition. Moreover, the amplifiers, being of balanced transformerless type, have been connected so that, in the 2-channel mode, the outputs of the left-back amplifier and the left-front amplifier connected to the left-front speaker are connected differentially to that speaker and the right-back and right-front amplifiers connected to the right-front speaker are also differentially connected to that speaker.

Each speaker has two input terminals and each amplifier has two output terminals, one of which is a common terminal such as ground. In the differential connection, the ungrounded, or "hot" signal output terminal of the front and back balanced transformerless amplifiers are connected to the two terminals of the corresponding front speaker. As a result, this speaker is energized with signals of doubled magnitudes so that the reproduction of sound from that speaker will be at a higher level than in the operating mode in which each speaker receives its energizing signal from only one amplifier.

The switching system used heretofore have had the disadvantage of complexity of two double-throw switches connected together and the circuit connections, leaving the supposedly unenergized back speakers in an open circuit condition, have made it possible for those speakers to pick up signals by stray capacitance and thus produce an undesired sound.

SUMMARY OF THE INVENTION

It is one object of the present invention to provide a simple circuit to connect, selectively, a pair of speakers to a pair of amplifiers to be separately energized thereby or to short-circuit one of the speakers while connecting the two amplifiers differentially to the other speaker. Further objects will be apparent from the following specification together with the drawings.

In accordance with the main object of the invention, a circuit is provided in which terminals that receive signals from two amplifiers are each connected to one terminal of a two-terminal load, such as a loudspeaker. The other terminals of the two loads are connected together to switching means that includes, basically, a single-pole, double-throw switch. Thearm of the switch is connected to the two interconnected load terminals, one of the fixed contacts of the switch is connected to the common connection of one of the signal-receiving terminals and the load terminal connected thereto, and the second fixed contact is connected to a common signal circuit point, usually ground. When the arm of the switch is connected to the second fixed contact, each of the amplifiers is simply connected to its respective load. When the arm of the switch is connected to the first fixed contact, the second load is short-circuited so that it cannot respond to stray signals and the first load is connected differentially across the two amplifiers.

DESCRIPTION OF THE PREFERRED EMBODIMENT

Figure 1:
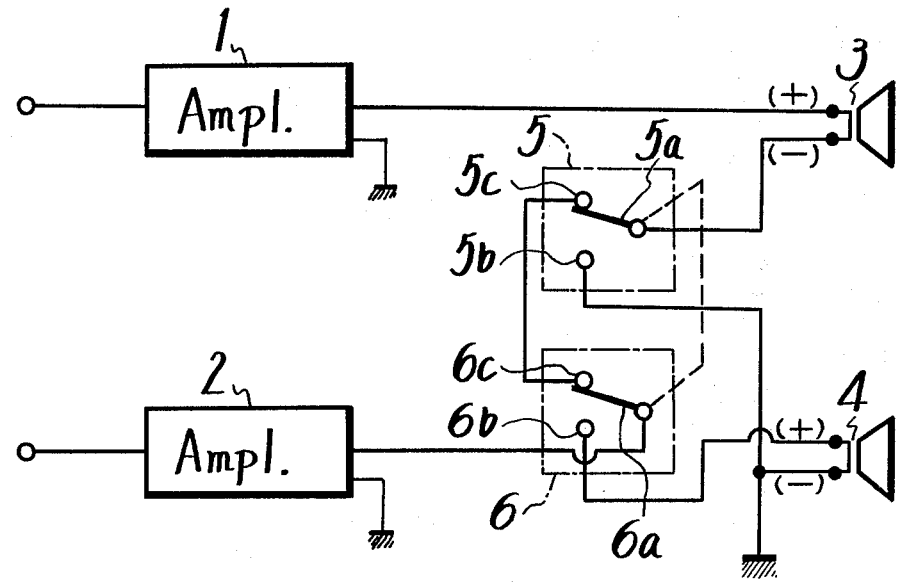
FIG 1 is a circuit diagram of two amplifiers and speakers connected according to the prior art.

The two amplifiers 1 and 2 shown in Fig. 1 are, typically, the right-front and right-back amplifiers of a 4-channel reproducing system. In a complete 4-channel system there would be two additional amplifiers connected in exactly the same way as the amplifiers 1 and 2, but there is not need to show or describe the other, identical half of the complete system. In addition to the two amplifiers, 1 and 2, there are two loudspeakers 3 and 4. Although these speakers are indicated as each comprising one driver and one cone, it is to be understood that, in accordance with well-known practice in high fidelity systems, the term "speaker" may include a complete system with several drivers and several cones. Each of the speakers 3 and 4 has two terminals to which audio power signals may be applied, and in each speaker the terminals are labeled plus (+) and minus (−) simply to indicate their relative polariy for connection in multi-channel systems.

Except for the plus terminal of the speaker 3, which is directly connected to the ungrounded output terminal of the amplifier 1, the speakers 3 and 4 are connected to the amplifiers 1 and 2 by two single-pole, double-throw switches 5 and 6. Although these appear to be separate switches, their arms 5a and 6a are connected together mechanically so that the two switches form, in effect, a double-pole, double-throw switch. The switch 5 has a fixed contact 5b that is connected directly to ground and to one terminal, the minus terminal, of the speaker 4. The switch 6 has a corresponding fixed terminal 6b connected to the plus terminal of the speaker 4. Each of the switches 5 and 6 has another fixed contact 5c and 6c, respectively, which are directly connected together.

The circuit in FIG. 1 has two modes of operation. In the first mode of operation in which the switch arms 5a and 6a would be resting against the contacts 5b and 6b, respectively, the corresponding minus terminals of both the speaker 3 and the speaker 4 are directly connected to ground. The output signal of the amplifier 1, which may be considered to be the right-front amplifier, would then be directly connected across the speaker 3, and the output signal of the amplifier 2 would be directly connected across the terminals of the speaker 4. In this first mode, each of the amplifiers 1 and 2 supplies audio power to energize its respective speaker 3 and 4.

In the other mode of operation, the arms 5a and 6a of the switches 5 and 6 are in the position shown, which places them against the contacts 5c and 6c, respectively. The ungrounded output terminals of both of the balanced transformerless amplifiers 1 and 2 are then connected to the speaker 3. Since the amplifiers 1 and 2 are connected differentially to the speaker 3 in this later mode, the speaker is energized by audio signals having the combined amplitudes of the amplifiers 1 and 2.

It will be noted that with the arms 5a and 6a in the positions shown, there is no apparent connection to the contact 6b and therefore, no apparent connection to the speaker 4. However, it is easily possible for stray capacitance in the cicuit to form a coupling between the arm 6a and the contact 6b, or in some way to couple at least some signal power to the speaker 4. This power may be enough to cause the speaker 4, which should be silent, to produce an undesired sound. Not only is the sound in itself undesired, but because of the reactance of the coupling circuit by which power reaches the speaker 4, the frequency characteristics of the sound may be particularly objectionable.

Figure 2:
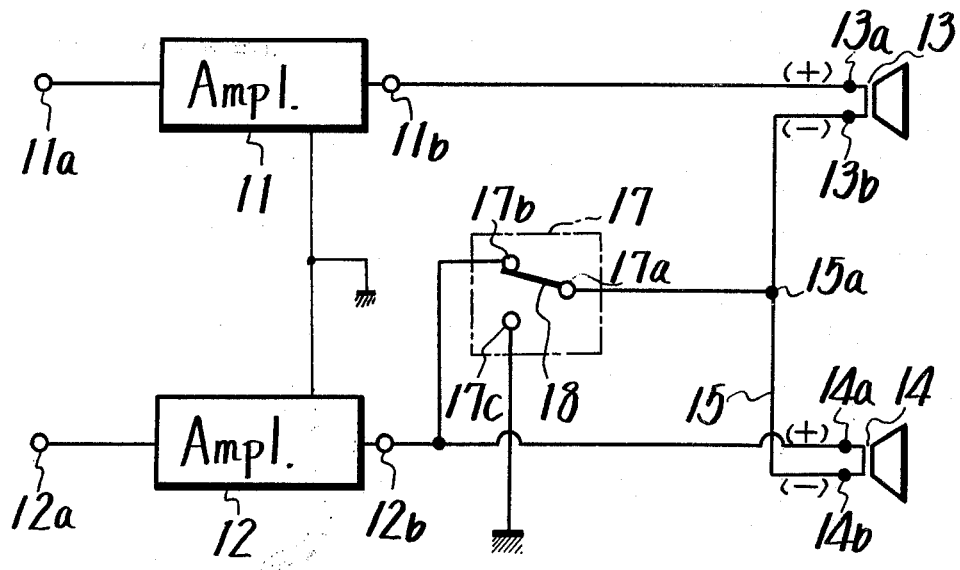
FIG 2 is a circuit diagram of two amplifiers and speakers connected according to the present invention.

In the circuit of the present invention shown in FIG 2, there are two input terminals 11a and 12a by which signals are connected to amplifiers 11 and 12. As in the circuit in FIG 1, the amplifier 11 may be the right-front (or left-front) amplifier of a 4-channel system and the amplifier 12 would then be the right-back (or left-back) amplifier for the system. Although each of the amplifiers 11 and 12 appears to have only a single input terminal, it is to be understood that, in accordance with standard practice, there is actually a second input terminal which is common to both amplifiers and is usually referred to as the ground terminal.

The two amplifiers 11 and 12 have output terminals 11b and 12b, each of which is connected to corresponding terminals 13a and 14a of a pair of speakers 13 and 14. As in the case of the input terminals 11a and 12a, the terminals 11b and 12b are each only one of the two input terminals for the respective amplifiers 11 and 12. The terminals 11b and 12b may be referred to as the "hot", or ungrounded, terminals of the respective amplifiers.

The other terminals 13b and 14b of the speakers 13 and 14 are connected directly together by a wire 15 and have a common circuit point 15a connected to one terminal 17a of a single-pole, double-throw switch 17. This switch has two other terminals 17b and 17c and is shown with its arm 18 making a direct connection between the terminals 17a and 17b. The terminal 17b is connected directly to the wire that joins the ungrounded output terminal 12b of the amplifier 12 to the terminal 14a of the speaker 14. The switch terminal 17c is connected directly to ground.

It will be seen that with the arm 18 of the switch 17 connected to the terminal 17c, the corresponding terminals 13b and 14b of the speakers 13 and 14 would both be connected directly to ground. Thus, the amplifier 11 would supply power directly to the speaker 13 and the amplifier 12 would independently supply power directly to the speaker 14. On the other hand, if the arm 18 of the switch 17 is in the position shown, the terminals 14a and 14b of the speaker 14 are short-circuited by a circuit that includes the section of wire 15 from the terminal 14b to the common circuit point 15a, the connection from this common circuit point to the switch terminal 17a, the arm 18 of the switch 17, and the connection between the contact 17b and the terminal 14a of the speaker 14. Part of this same circuit connects the output terminal 12b of the amplifier 12 to the terminal 13b of the speaker 13 so that the two amplifiers 11 and 12 are differentially connected to the speaker 13. Thus the speaker 13 receives power from both of the amplifiers 11 and 12 just as the speaker 3 received power from both of the amplifiers 1 and 2 of the circuit in FIG. 1, but the speaker 14 cannot be energized because its terminals 14a and 14b are short-circuited. This is advantageous in preventing unwanted sound from the speaker 14, but of even greater importance is the simplification of the switching section of the circuit to require only a single switch 17 in place of the two switches 5 and 6 in FIG. 1.

In the circuit in FIG. 2 the fact that only a single switch 17 is required permits a saving in cost and a saving in space relative to the circuit in FIG. 1. It is especially suited for cascade-connection of amplifiers of stereophonic systems.

Although the invention has been described in specific terms in connection with only two amplifiers and speakers, it should be understood that it is adapted for use with a 4-channel stereophonic system and that other modifications can be made within the true scope of the invention as defined by the following claims.

What is claimed is

1. An amplifier output circuit comprising
   A. first and second balanced signal terminals and a common signal terminal;
   B. first and second loads;
   C. switching means connected to said second balaced signal terminal and to said first and second loads to switch said output circuit selectively to a first or a second operating mode, said first load being connected between said first balanced terminal and said common signal terminal and said second load being connected between said second balanced terminal and said common signal terminal in said first mode, and said first load being connected across said first and second balanced signal terminals and said second load being short circuited in said second mode.

2. The circuit of claim 1 in which each of said loads has a first terminal and a second terminal, said first terminal of said first load being connected to said first balanced terminal, said first terminal of said second load being connected to said second balanced terminal, and said second terminal of each of said loads being connected together.

3. The circuit of claim 2 in which said switching means comprises
   A. a first switch terminal connected to said second terminals of said loads;
   B. a second switch terminal connected to said first terminal of said second load;
   C. a third switch terminal connected to said common signal terminal; and
   D. means to connect said first switch terminal to said second switch terminal to establish said second mode or to said third switch terminal to establish said first mode.

4. The circuit of claim 1 in which said first and second loads are first and second loudspeakers, respectively.

5. The amplifier circuit of claim 1 comprising first and second balanced transformerless amplifiers, said first balanced signal terminal and said common signal terminal comprising output terminals of said first balanced transformerless amplifier, and said second balanced signal terminal and said common signal terminal comprising output terminals of said second balanced transformerless amplifier.

* * * * *